US006654281B2

(12) United States Patent
Georgakos et al.

(10) Patent No.: US 6,654,281 B2
(45) Date of Patent: Nov. 25, 2003

(54) NONVOLATILE NOR SEMICONDUCTOR MEMORY DEVICE AND METHOD FOR PROGRAMMING THE MEMORY DEVICE

(75) Inventors: Georg Georgakos, Fraunberg (DE); Kai Huckels, Wolfsburg (DE); Jakob Kriz, Weinböhla (DE); Christoph Kutter, Dresden (DE); Andreas Liebelt, München (DE); Christoph Ludwig, Langebrück (DE); Elard Stein von Kamienski, Dresden (DE); Peter Wawer, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/177,884

(22) Filed: Jun. 20, 2002

(65) Prior Publication Data

US 2003/0007386 A1 Jan. 9, 2003

Related U.S. Application Data

(63) Continuation of application No. PCT/DE99/04042, filed on Dec. 20, 1999.

(51) Int. Cl.[7] .............................................. G11C 16/04
(52) U.S. Cl. ........................... 365/185.05; 365/185.17; 365/185.18
(58) Field of Search ..................... 365/185.05, 185.12, 365/185.17, 185.18, 185.26, 185.29, 185.33

(56) References Cited

U.S. PATENT DOCUMENTS

| 4,734,345 | A | * | 3/1988 | Nomura et al. .............. 430/311 |
| 5,557,569 | A | * | 9/1996 | Smayling et al. ....... 365/185.28 |
| 5,598,369 | A | * | 1/1997 | Chen et al. ............. 365/185.18 |
| 5,608,672 | A | * | 3/1997 | Tang et al. ............. 365/185.26 |
| 5,671,177 | A | * | 9/1997 | Ueki ...................... 365/185.12 |
| 5,687,120 | A | * | 11/1997 | Chang et al. ........... 365/185.33 |
| 5,760,437 | A | | 6/1998 | Shimoji ...................... 257/316 |
| 5,850,091 | A | * | 12/1998 | Li et al. ...................... 257/317 |
| 5,999,444 | A | * | 12/1999 | Fujiwara et al. ....... 365/185.23 |
| 6,212,103 | B1 | * | 4/2001 | Ahrens et al. .......... 365/185.29 |
| 6,396,737 | B2 | * | 5/2002 | Yoon et al. ............. 365/185.05 |

FOREIGN PATENT DOCUMENTS

| DE | 27 58 161 A1 | 7/1978 |
| EP | 0 137 207 A2 | 4/1985 |
| JP | 09 082 926 A | 3/1997 |

\* cited by examiner

*Primary Examiner*—Trong Phan
(74) *Attorney, Agent, or Firm*—Laurence A. Greenberg; Werner H. Stemer; Gregory L. Mayback

(57) ABSTRACT

A nonvolatile NOR semiconductor memory device and a method for programming the memory device are described. The memory device has a multiplicity of one-transistor memory cells disposed in a matrix form being driven both via word lines and via bit lines. In this case, each one-transistor memory cell has both a source line and a drain line, as a result of which selective driving of the respective drain and source regions is obtained. In this way, a leakage current in the semiconductor memory device can be optimally reduced with minimal space requirement.

12 Claims, 4 Drawing Sheets

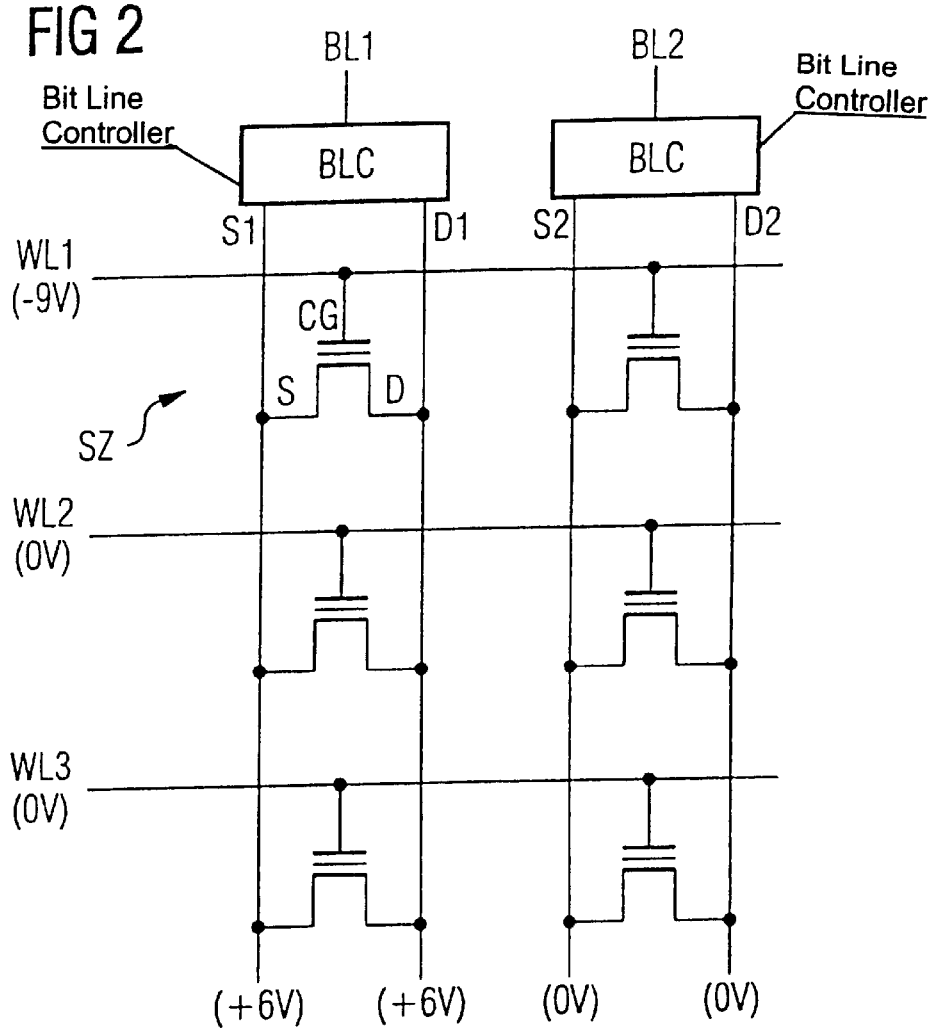
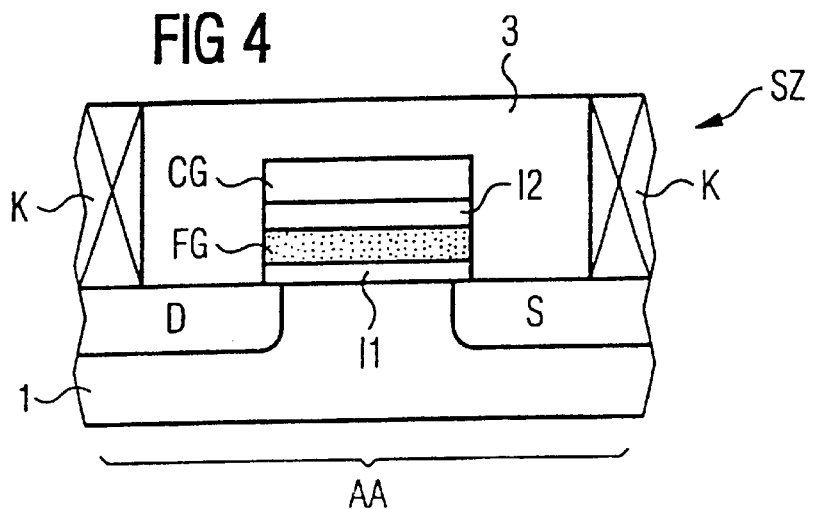

NONVOLATILE NOR SEMICONDUCTOR MEMORY DEVICE AND METHOD FOR PROGRAMMING THE MEMORY DEVICE

CROSS-REFERENCE TO RELATED APPLICATION

This application is a continuation of copending International Application No. PCT/DE99/04042, filed Dec. 20, 1999, which designated the United States and was not published in English.

BACKGROUND OF THE INVENTION

Field of the Invention

The present invention relates to a nonvolatile semiconductor memory device and a method for programming it and, in particular, to a flash EEPROM memory with a novel NOR gate transistor array architecture.

The majority of computer units or computers currently use magnetic disk drives for storing relatively large volumes of data. However, such disk drives or mechanical storage devices require a relatively large space and have a multiplicity of moving parts. Consequently, they are prone to faults and have a considerable current consumption. Furthermore, future computer units or computers and other digital devices such as, for example, digital cameras or palm devices or personal telecommunication/telephone apparatus (PTAs) will become smaller and smaller, for which reason conventional mechanical storage devices are unsuitable.

As an alternative to such conventional mechanical storage devices nonvolatile semiconductor memory devices have recently gained increasing acceptance, these devices being known for example as flash memory EEPROM, EPROM and the like. The so-called NAND and NOR semiconductor memory devices are known as the most important representatives of such electrically erasable and electrically programmable memory devices. In both semiconductor memory devices the memory cells have so-called one-transistor memory cells, a drain region and a source region usually being formed in a semiconductor substrate and there being situated above the channel section lying in between an insulated charge-storing layer and, disposed above the latter, an insulated control layer. To program such a one-transistor cell, relatively high voltages are applied to the control layer and the drain region, while the source region is usually grounded. Under such circumstances charge carriers are introduced into the charge-storing layer by channel injection, injection of hot charge carriers and/or Fowler-Nordheim tunneling. In this case, the charge carriers remain in the charge-storing layer and effect a lasting change in the switching behavior of the respective field-effect transistor.

Whereas in the NAND semiconductor memory devices described above a multiplicity of one-transistor memory cells are serially connected to one another and are driven via a common selection gate, the respective one-transistor memory cells in NOR semiconductor memory devices are organized in parallel or in matrix form, as a result of which each memory cell can be selected individually.

The present invention relates exclusively to such NOR semiconductor memory devices.

In accordance with known nonvolatile NOR semiconductor memory devices, a multiplicity of one-transistor memory cells are disposed in a matrix form, i.e. in rows and columns. As has already been described above, each one-transistor memory cell contains mutually spaced-apart drain and source regions, which are formed in a semiconductor substrate. In this case, a control layer is respectively connected row by row to an associated word line. In contrast, the drain regions of the respective one-transistor memory cells are connected column by column to a respective bit line. The source regions of the nonvolatile NOR semiconductor memory device are all grounded or are all connected to one another, which is why such a NOR semiconductor memory device is referred to as a memory device with a "common source" architecture.

The relatively high current consumption during a programming operation is disadvantageous, however, in the case of such conventional semiconductor memory devices. This is because the current consumption is essentially determined from the sum of a programming current of the selected memory cells (i.e. memory cells to be programmed) and of a leakage current of non-selected memory cells. Although, for each individual memory cell, the leakage current of the non-selected memory cells lies far below a respective leakage or programming current of a selected memory cell, the sum of the leakage currents of all the unselected memory cells is of a similar order of magnitude to the programming current for the selected memory cell, particularly in the case of large arrays or memory cell arrays.

SUMMARY OF THE INVENTION

It is accordingly an object of the invention to provide a nonvolatile NOR semiconductor memory device and a method for programming the memory device that overcome the above-mentioned disadvantages of the prior art devices and methods of this general type, in which a leakage current in the non-selected memory cells and thus a total current consumption are reduced.

With the foregoing and other objects in view there is provided, in accordance with the invention, a nonvolatile NOR semiconductor memory device containing a semiconductor substrate and a multiplicity of one-transistor memory cells formed in the semiconductor substrate and disposed in a matrix form. The one-transistor memory cells has mutually spaced-apart drain regions and source regions, a first insulating layer, a charge-storing layer, a second insulating layer, and a control layer. A multiplicity of word lines are connected to and row-by-row drive the one-transistor memory cells, and the word lines are substantially formed by the control layer. A multiplicity of bit lines are connected to and column-by-column drive the one-transistor memory cells. The bit lines each have a source line and a drain line for enabling a selective driving of the drain regions and the source regions in respective columns of the one-transistor memory cells. The source line and the drain line are formed in a meandering shape, a zigzag shape or an undulating form.

In particular the use of selectively drivable source lines and drain lines for respective bit lines enables selective driving of the respective source regions, as a result of which the current consumption during programming or the occurrence of leakage currents can be significantly reduced.

The respective source and drain lines are preferably formed in meandering, zigzag or undulating form, thereby producing a significant saving of area and enabling large scale integrated semiconductor memory devices.

The space requirement is reduced further by forming the source and drain lines in different electrically conductive layers.

In accordance with an added feature of the invention, a common electrically conductive layer is provided and the source line and the drain line are formed from the common electrically conductive layer. The source line and the drain line are disposed substantially parallel to one another.

Alternatively, the source line and the drain line are disposed substantially in an overlapping manner in different electrical conductive layers.

In accordance with an additional feature of the invention, drain/source contacts are disposed substantially rectilinearly for producing a connection between the drain and source lines and the drain and source regions of the one-transistor memory cells.

In accordance with a further feature of the invention, a metallization layer is provided and the source line and the drain line are formed from the metallization layer.

In accordance with another feature of the invention, a plurality of metallization layers are provided and the source line and the drain line are formed in the plurality of metallization layers.

In the method for programming the nonvolatile NOR semiconductor memory device, preferably predetermined voltages are applied both to the source line and to the drain line. As an alternative to this, however, the programming voltages can also be applied only to the drain lines or source lines, while their associated source lines or drain lines are floating or have a floating voltage.

With the foregoing and other objects in view there is provided, in accordance with the invention, a method for programming a memory cell. The method includes providing a nonvolatile NOR semiconductor memory device; applying a predetermined gate voltage to a selected one of the word lines; applying a predetermined source voltage to a selected source line; and applying a predetermined drain voltage to a selected drain line. The predetermined drain voltage substantially corresponds to the predetermined source voltage.

In accordance with an added mode of the invention, there is the step of setting a potential difference between the selected source line and the selected drain line so as not to at any time have a higher potential difference than in a read mode.

With the foregoing and other objects in view there is further provided, in accordance with the invention, a method for programming a memory cell. The method includes providing a nonvolatile NOR semiconductor memory device; applying a predetermined gate voltage to a selected one of the word lines; allowing an electrical potential of a selected source line to float; and applying a predetermined drain voltage to a selected drain line.

With the foregoing and other objects in view there is additionally provided, in accordance with the invention, a method for programming a memory cell. The method includes providing a nonvolatile NOR semiconductor memory device; applying a predetermined gate voltage to a selected one of the word lines; applying a predetermined source voltage to a selected source line; and allowing an electrical potential of a selected drain line to float.

Other features which are considered as characteristic for the invention are set forth in the appended claims.

Although the invention is illustrated and described herein as embodied in a nonvolatile NOR semiconductor memory device and a method for programming the memory device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a simplified circuit diagram of an equivalent circuit diagram of the nonvolatile NOR semiconductor memory device according to the invention;

FIG. 4 is diagrammatic, sectional view taken along the line IV—IV shown in FIG. 3;

DESCRIPTION OF THE PREFERRED EMBODIMENTS

Figure 1:
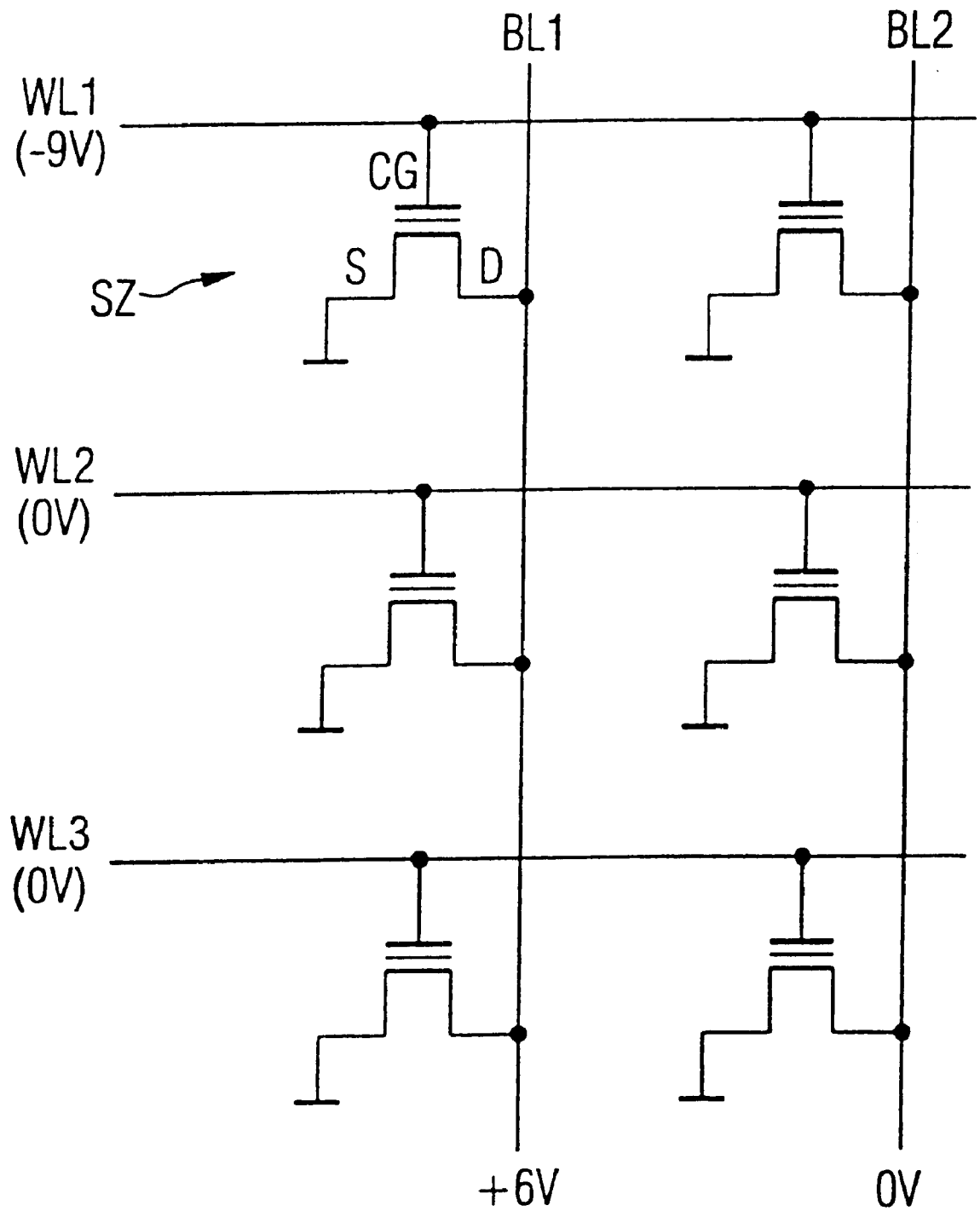
FIG. 1 is simplified circuit diagram of a nonvolatile NOR semiconductor memory device in accordance with the prior art.

Referring now to the figures of the drawing in detail and first, particularly, to FIG. 1 thereof, there is shown a simplified illustration of an equivalent circuit diagram of a nonvolatile NOR semiconductor memory device in accordance with the prior art. In accordance with FIG. 1, a multiplicity of one-transistor memory cells SZ are disposed in a matrix form, i.e. in rows and columns. As has already been described above, each one-transistor memory cell SZ contains mutually spaced-apart drain and source regions D and S, which are formed in a semiconductor substrate. In this case, a control layer CG is respectively connected row by row to an associated word line WL1, WL2 and WL3. In contrast, the drain regions D of the respective one-transistor memory cells SZ are connected column by column to a respective bit line BL1 and BL2. The source regions S of the nonvolatile NOR semiconductor memory device are all grounded or are all connected to one another, which is why such a NOR semiconductor memory device is referred to as a memory device with a "common source" architecture.

The relatively high current consumption during a programming operation is disadvantageous, however, in the case of such conventional semiconductor memory devices. This is because the current consumption is essentially determined from the sum of a programming current of the selected memory cells (i.e. memory cells to be programmed) and of a leakage current of non-selected memory cells. Although, for each individual memory cell, the leakage current of the non-selected memory cells lies far below a respective leakage or programming current of a selected memory cell, the sum of the leakage currents of all the unselected memory cells is of a similar order of magnitude to the programming current for the selected memory cell, particularly in the case of large arrays or memory cell arrays.

FIG. 2 shows a simplified illustration of an equivalent circuit diagram of a nonvolatile NOR semiconductor memory device according to the present invention. In this case, identical reference symbols designate identical or similar elements, for which reason their description is dispensed with below.

The nonvolatile NOR semiconductor memory device according to the invention again contains a multiplicity of the one-transistor memory cells SZ which are formed in a semiconductor substrate, are disposed in matrix form and are driven via a multiplicity of word lines WL1, WL2 and WL3 and a multiplicity of bit lines BL1 and BL2. In contrast to the conventional NOR semiconductor memory device with the "common source" architecture, the one-transistor memory cells SZ according to the present invention can be selectively driven via a source line S1, S2, etc. and via a drain line D1, D2, etc. The selective driving is carried out for example via a respective bit line controller BLC which is realized as it were by the common bit lines BL1 and BL2, etc. On account of the selective driving of the respective source regions S of respective one-transistor memory cells SZ, the nonvolatile NOR semiconductor memory device according to the invention is preferably referred to as SNOR-flash (selective NOR).

To program the one-transistor memory cell SZ, a voltage of −9 V is applied to the control layer CG via the word line WL1, for example (as illustrated in FIGS. 1 and 2), while the associated source and drain regions S and D are put at a potential of +6 V, for example, via the associated source and drain lines S1 and D1. In this way, a "1" is written to the one-transistor memory cell SZ or the charge-storing layer is positively charged. Since a lateral field is greatly reduced in particular between the source region S and the drain region D on account of the voltages of the same magnitude (+6 V), a significantly reduced leakage current compared with the prior art can be observed in particular in the non-selected one-transistor memory cells of the word lines WL2 and WL3. In accordance with FIG. 2, the non-selected word lines WL2, WL3, . . . have a voltage of 0 V (similarly FIG. 1). However the voltage of the non-selected word lines WL2,WL3, . . . preferably lies at a voltage which corresponds to the arithmetic mean (e.g. 3 V) of a voltage of the selected bit line BL1 and a voltage of the non-selected bit line, as a result of which a leakage current can be reduced further.

In this case what is to be given consideration as a leakage current is, in particular, a gate induced drain leakage (GIDL) current, which is significantly reduced in the case of the SNOR architecture illustrated in FIG. 2 compared with the conventional NOR architecture with common source line (common source) in accordance with FIG. 1. This is because, in FIG. 1, on account of the common potential in the source regions S, strong lateral fields are generated between the source and drain in the non-selected memory cells (WL2, WL3), which are several orders of magnitude above those in the SNOR architecture according to the invention. The current consumption in particular during a programming operation (writing, erasing) is thus significantly reduced since a proportion of, in particular, the gate induced drain leakage currents in the non-selected memory cells is significantly reduced. A construction of very large arrays or memory cell arrays can therefore be realized in a simple manner using the SNOR architecture according to the invention.

Figure 3:
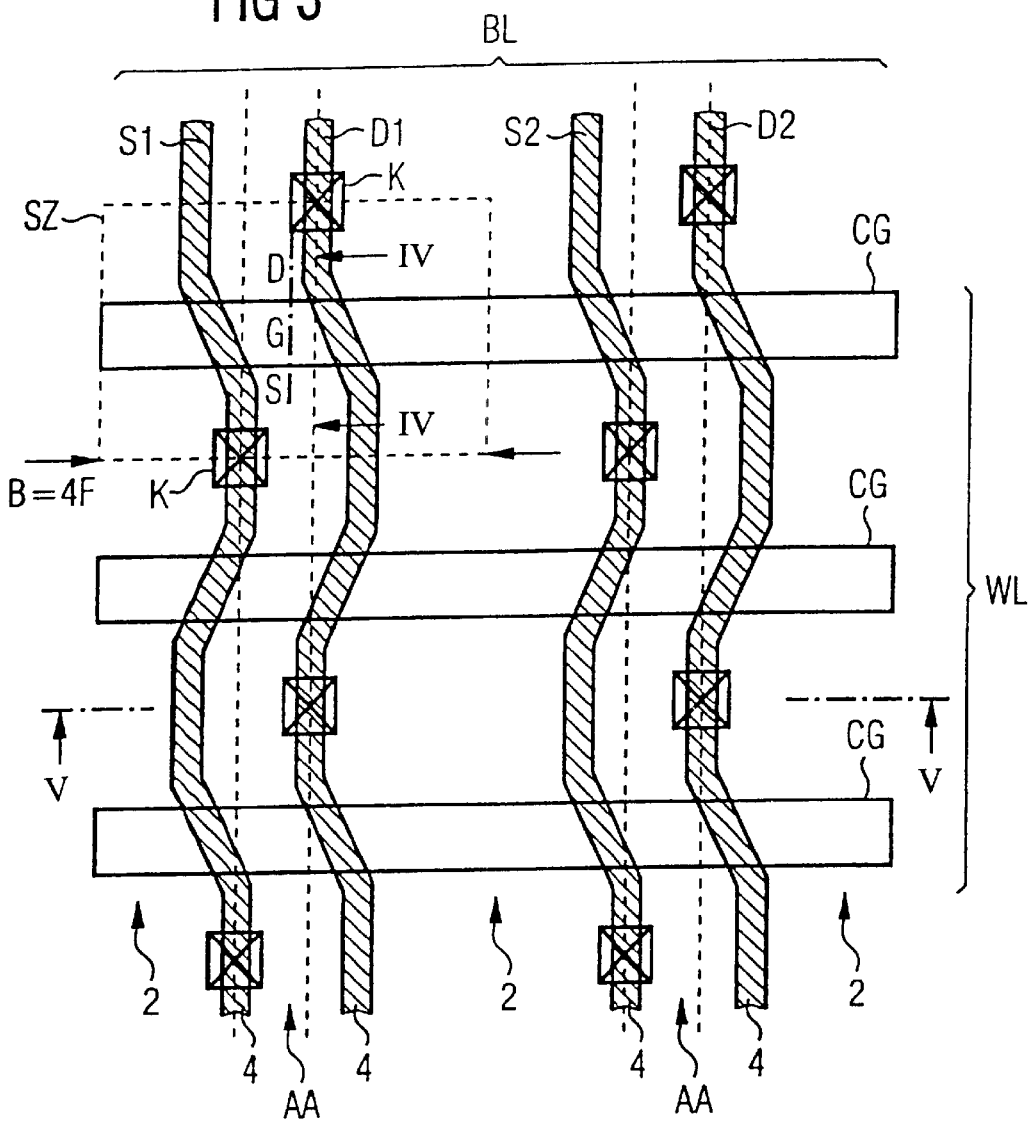
FIG. 3 is diagrammatic layout of the NOR semiconductor memory device according to the invention in accordance with a first exemplary embodiment.

FIG. 3 shows a simplified illustration of a layout of the NOR semiconductor memory device according to the invention in accordance with a first exemplary embodiment. Identical reference symbols again designate identical or similar elements, for which reason their detailed description is dispensed with below.

In accordance with FIG. 3, the one-transistor memory cells SZ are formed in active regions AA of a semiconductor substrate. Such active regions AA are preferably formed by diffusion or implantation and have an essentially strip-type structure in accordance with FIG. 3. The multiplicity of strip-type active regions AA disposed in columns have superposed on them in rows layer stacks that are likewise formed in strip form, a topmost layer constituting the control layer CG of the one-transistor memory cells SZ. Each crossover point between such a strip-type active region AA and a control layer CG formed in strip form thus represents a field-effect transistor or a one-transistor memory cell SZ. In order to make contact with respective drain regions D and source regions S, contacts K are formed which are disposed essentially rectilinearly but can also reach into an adjoining insulation region 2 (STI, shallow trench isolation). The source lines S1, S2 etc. and the drain lines D1, D2 etc. are then situated in a further overlying layer, which preferably constitutes a first metallization layer. In this case, the drain lines D1, D2 are connected via corresponding contacts K to the associated drain region D of the active region AA, the source lines S1, S2 being connected in the same way via corresponding contacts K to the associated source regions S.

In accordance with FIG. 3, the source regions S of a one-transistor memory cell SZ are in each case connected to the source regions S of an adjacent one-transistor memory cell SZ. In the same way, the drain regions D of respectively adjacent one-transistor memory cells are directly connected to one another, thereby producing an embodiment that is particularly effective in terms of saving area. In order to further reduce the area of the one-transistor memory cell SZ, the source lines S1, S2 and the drain lines D1, D2 are preferably formed in an undulating form. However, they can also be formed in meandering or zigzag form provided that this results in a space saving and the respective contacts K can be connected. In order to further reduce an area requirement, the source and drain lines S1, S2, D1 and D2 are disposed substantially parallel to one another. This yields a large scale integrable memory device having an optimized cell width of merely B=4F.

FIG. 4 shows a simplified sectional view of the one-transistor memory cell SZ taken along a section IV—IV in FIG. 3. Accordingly, the one-transistor memory cell SZ contains a nonvolatile semiconductor memory cell is formed in a substrate 1 or an active region AA of the substrate 1. In this case, the drain region D is spaced apart from the source region S by a channel region, at whose surface a first insulating layer 11, a charge-storing layer FG (floating gate), a second insulating layer 12 and the concluding control layer CG (control gate) are formed. Contact is made with the drain is region D and the source region S through the contacts K. In this case, a further insulating layer or passivation layer 3 insulates each layer stack or each one-transistor memory cell SZ from its adjacent one.

Figure 5:
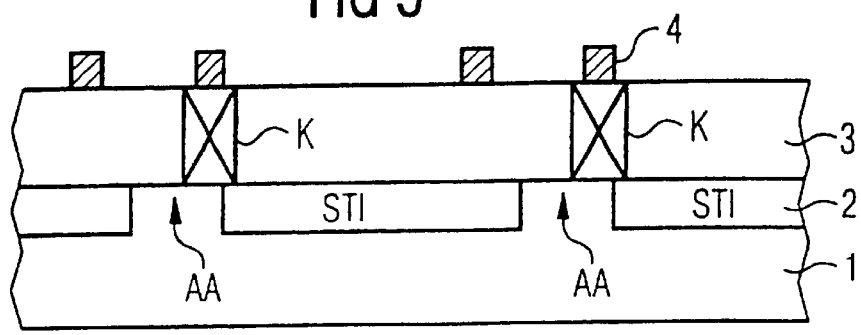
FIG. 5 is a simplified sectional view taken along the line V—V shown in FIG. 3.

FIG. 5 shows a further simplified sectional view of the NOR semiconductor memory device according to the invention taken along a section V—V shown in FIG. 3. In accordance with the sectional view, the active regions AA in the semiconductor substrate 1, which constitutes a silicon semiconductor substrate 1, for example, are insulated from one another by a shallow trench isolation 2 (STI). In this case, the contacts K can be placed onto the active regions AA in a slightly offset manner and partly reach into the shallow trench isolation 2. In accordance with FIG. 5, the source and drain lines S1, S2, D1 and D2 are formed in a first metallization plane or electrically conductive layer 4 and are each situated at the same level. What is essential to the present invention here is that only the drain lines D1 and D2 are connected to the associated contacts K, while the associated source lines S1 and S2, spaced apart from the further insulating layer 3, have no contact with the active region AA and are laterally offset. Accordingly, the source and drain lines are preferably formed in the common electrically conductive layer 4, which may, for example, also constitute a highly doped polysilicon layer. An essential advantage when using such electrically conductive layers for example in comparison with conventional buried layers in the semiconductor substrate 1 is that the resistance is significantly reduced, thereby improving in particular the access times or the access speed to the semiconductor memory device.

In accordance with FIGS. 3 to 5, then, the source and drain lines S1 to D2 are formed in the same electrically conductive layer 4. However, the source and drain lines S1 to D2 can also be realized in different layers, which is described below with reference to FIG. 6.

Figure 6:
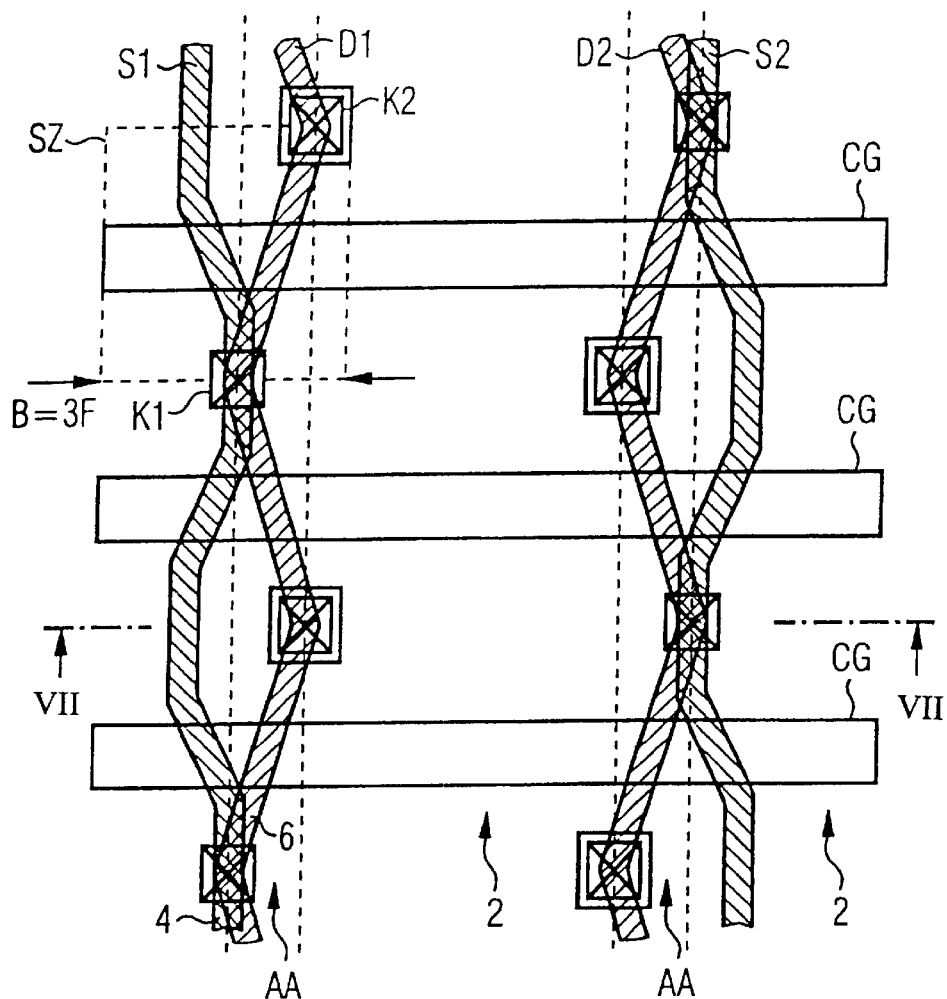
FIG. 6 is a simplified illustration of a layout of the NOR semiconductor memory device according to the invention in accordance with a second exemplary embodiment.

FIG. 6 shows a simplified illustration of a layout of the NOR semiconductor memory device in accordance with a second exemplary embodiment, identical reference symbols designating identical or similar elements. A repeated detailed description is therefore dispensed with below.

In contrast to the semiconductor memory device in accordance with the first exemplary embodiment, in the semiconductor memory device in accordance with the second exemplary embodiment, the source and drain lines S1 to D2 are realized in different electrically conductive layers. In this way, it is also possible to realize overlapping structures for the drain and source lines, thereby producing a further saving of area. Accordingly, the width of a one-transistor memory cell SZ in accordance with FIG. 6 is reduced to B=3F.

Figure 7:
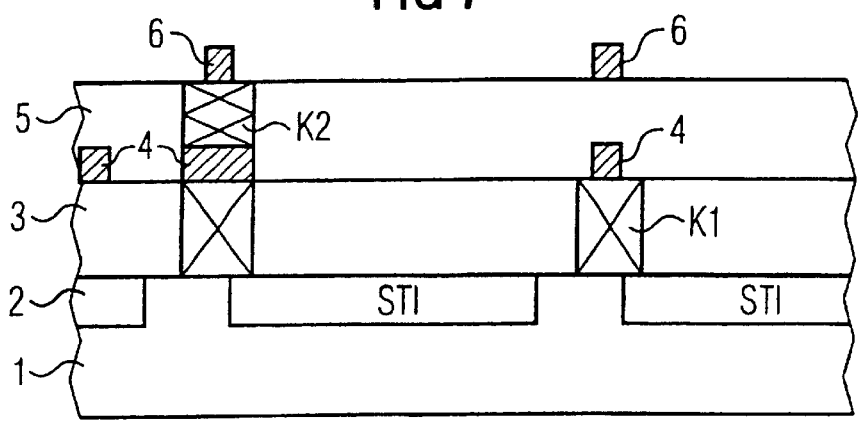
FIG. 7 is a sectional view taken along the line VII—VII shown in FIG. 6.

For further illustration, FIG. 7 shows a simplified sectional view of the NOR semiconductor memory device in accordance with the second exemplary embodiment taken along a section VII—VII shown in FIG. 6. In accordance with FIG. 7, now only the source lines S1 and S2 are situated in the first metallization layer 4, while the drain lines D1 and D2 are realized in a second metallization layer 6 disposed above the latter. In this case, the further metallization layer 6 is supported by a further insulating layer 5. A further contact K2 is used for making contact with the further electrically conductive layer 6, which contact K2 is substantially formed on a contact K1 or a part of the electrically conductive layer 4. This yields a NOR semiconductor memory device with reduced leakage current and further reduced space requirement.

A method for programming the NOR semiconductor memory device described above is described below. On account of the selectively drivable source and drain regions, essentially three different programming methods with reduced current consumption or reduced leakage current are possible.

As has already been described with reference to FIG. 2, the first possibility for programming the NOR semiconductor memory device according to the invention consists in both the drain line and the source line receiving a predetermined drain voltage and source voltage. As is already illustrated in FIG. 2, a lateral field between source and drain regions can be optimally reduced in this way, for which reason in particular a gate induced drain leakage current (GIDL) is significantly reduced in the non-selected memory cells.

As an alternative to this, however, it is also possible for a predetermined drain voltage (programming voltage) to be applied only on the drain line, while the associated source line is floating. In this case, although there is a non-negligible potential difference between drain region D and source region S, this occurs only for the selected column in the respective memory array. The source regions of non-selected bit lines (of further memory cell columns) still remain at 0 V, for example, for which reason essentially no leakage current is generated.

As a further alternative, it is possible for a predetermined source voltage (programming voltage) to be applied only on the source line, while the associated drain line is floating. In this case, the effects with regard to the leakage current are the same as in the previously described case.

The use of a voltage on the non-selected word lines which corresponds to the arithmetic mean of the voltages on the selected and non-selected bit lines affords, as further advantage, the effect that the respective memory cells on non-selected word lines but selected bit lines experience no undesired "incipient programming" or "gate disturb".

All three programming methods described are essentially based on reduced horizontal source-drain fields (field strengths), thereby reducing damage to the first insulating layer (e.g. tunnel oxide layer). In this way the lifetime or the number of write/erase cycles in the nonvolatile semiconductor memory device can be significantly improved.

The invention has been described above with reference to flash memory devices. However, it is not restricted thereto but rather encompasses all further nonvolatile memory devices or devices with nonvolatile memory cells such as e.g. FPGAs. The source and drain lines are preferably formed in the first and second metallization planes. However, the invention is not restricted to this but rather encompasses all further electrically conductive layers such as e.g. polysilicon layers that can also be formed in higher planes.

We claim:
1. A nonvolatile NOR semiconductor memory device, comprising:
   a semiconductor substrate;
   a multiplicity of one-transistor memory cells formed in said semiconductor substrate and disposed in a matrix form, said one-transistor memory cells containing mutually spaced-apart drain regions and source regions, a first insulating layer, a charge-storing layer, a second insulating layer, and a control layer;
   a multiplicity of word lines connected to and row-by-row driving said one-transistor memory cells, said word lines substantially formed by said control layer; and
   a multiplicity of bit lines connected to and column-by-column driving said one-transistor memory cells, said bit lines each having a source line and a drain line for enabling a selective driving of said drain regions and said source regions in respective columns of said one-transistor memory cells, said source line and said drain line formed in a shape selected from the group consisting of a meandering shape, a zigzag shape and an undulating form.

2. The nonvolatile NOR semiconductor memory device according to claim 1, further comprising a common electrically conductive layer and said source line and said drain line are formed from said common electrically conductive layer.

3. The nonvolatile NOR semiconductor memory device according to claim 1, further comprising different electrically conductive layers and said source line and said drain line are formed in said different electrically conductive layers.

4. The nonvolatile NOR semiconductor memory device according to claim 2, wherein said source line and said drain line are disposed substantially parallel to one another.

5. The nonvolatile NOR semiconductor memory device according to claim 3, wherein said source line and said drain line are disposed substantially in an overlapping manner.

6. The nonvolatile NOR semiconductor memory device according to claim 1, further comprising drain/source contacts disposed substantially rectilinearly for producing a connection between said drain and source lines and said drain and source regions of said one-transistor memory cells.

7. The nonvolatile NOR semiconductor memory device according to claim 1, further comprising a metallization layer and said source line and said drain line are formed from said metallization layer.

8. The nonvolatile NOR semiconductor memory device according to claim 1, further comprising a plurality of metallization layers and said source line and said drain line are formed in said plurality of metallization layers.

9. A method for programming a memory cell, which comprises the steps of:
    providing the nonvolatile NOR semiconductor memory device according to claim 1;
    applying a predetermined gate voltage to a selected one of the word lines;
    applying a predetermined source voltage to a selected source line; and
    applying a predetermined drain voltage to a selected drain line, the predetermined drain voltage substantially corresponding to the predetermined source voltage.

10. The method according to claim 9, which comprises setting a potential difference between the selected source line and the selected drain line so as not to at any time have a higher potential difference than in a read mode.

11. A method for programming a memory cell, which comprises the steps of:
    providing the nonvolatile NOR semiconductor memory device according to claim 1;
    applying a predetermined gate voltage to a selected one of the word lines;
    allowing an electrical potential of a selected source line to float; and
    applying a predetermined drain voltage to a selected drain line.

12. A method for programming a memory cell, which comprises the steps of:
    providing the nonvolatile NOR semiconductor memory device according to claim 1;
    applying a predetermined gate voltage to a selected one of the word lines;
    applying a predetermined source voltage to a selected source line; and
    allowing an electrical potential of a selected drain line to float.

* * * * *